United States Patent [19]

Burth

[11] 4,171,492

[45] Oct. 16, 1979

[54] TEMPERATURE COMPENSATED ZENER DIODE ARRANGEMENT

[75] Inventor: Rolf D. Burth, Emmendingen, Fed. Rep. of Germany

[73] Assignee: ITT Industries, Inc., New York, N.Y.

[21] Appl. No.: 826,445

[22] Filed: Aug. 22, 1977

[30] Foreign Application Priority Data

Jul. 10, 1976 [DE] Fed. Rep. of Germany ....... 2645182

[51] Int. Cl.[2] .............................................. H03K 3/26

[52] U.S. Cl. .................................... 307/310; 307/254; 307/318

[58] Field of Search ........................ 307/318, 310, 254; 357/13

[56] References Cited

U.S. PATENT DOCUMENTS

| | | | |
|---|---|---|---|
| 3,567,965 | 3/1971 | Weinerth | 307/318 |
| 3,820,007 | 6/1974 | Schilling et al. | 357/13 |
| 3,936,863 | 2/1976 | Olmstead | 357/13 |
| 3,997,802 | 12/1976 | Hoehn | 307/318 |

*Primary Examiner*—Stanley D. Miller, Jr.
*Assistant Examiner*—B. P. Davis
*Attorney, Agent, or Firm*—John T. O'Halloran; Peter C. Van Der Sluys; Stephen B. Goldman

[57] ABSTRACT

A zener diode is disclosed which is temperature-compensated for a special application. If a zener diode is operated with a switch shunted across it, and its on-off ratio is variable, its dissipation will vary. It is proposed to form on the zener diode crystal an additional dissipative component which is switched on/off in an opposite sense to that of the zener diode. Thus, the total dissipation remains constant.

9 Claims, 2 Drawing Figures

TEMPERATURE COMPENSATED ZENER DIODE ARRANGEMENT

BACKGROUND OF THE INVENTION

The present invention relates to a temperature-compensated zener diode arrangement in the form of a semiconductor integrated circuit consisting of several transistor structures formed within a common body of semiconductor material and interconnected by layers of metallization. The base-emitter pn junctions of the transistor structures are so connected in series relative to the direction of the total current flowing in operation that part of them are operated in the reverse direction up to the breakdown voltage as zener diodes, while the remainder are operated in the forward direction as forward-biased diodes. The emitter of the first transistor structure acting as a zener diode or the base of a transistor structure acting as a forward-biased diode and the collector thereof are connected to a first external terminal, while the emitter of the last transistor structure acting as a forward-biased diode is connected to a second external terminal, as is known in principle from German Offenlegungsschrift (DT-OS) No. 1,589,707 and the corresponding German Auslegeschrift (DT-AS), from German Offenlegungsschrift No. 1,639,173 and the corresponding German Auslegeschrift, and from German Offenlegungsschrift No. 1,764,251.

These temperature-compensated zener diode arrangements have such a low temperature coefficient that they can be used in varactor-tuned radio and television receivers, where they generate the temperature-stable and fixed bias necessary to tune the varactor diodes. To are energized this, the known temperature-compensated zener diode arrays are operated like conventional zener diodes, i.e., a conventional shunt regulator is formed by means of a series-dropping resistor having one terminal connected to an unregulated dc voltage source.

With the development of all-electronic tuners with touch-contact operation, remote control capability, and generation of the voltage values associated with the individual receive channels by means of a pulse train of variable pulse duty factor, a new mode of operation of the known temperature-compensated zener diode arrangements has come into use. The zener diode arrangements are periodically short-circuited by means of a switch connected across them and controlled by the pulse train of variable pulse duty factor. If operated with a fixed pulse duty factor for a longer period of time, the zener diode arrangements will reach a thermally stable state, but if the pulse duty factor is suddenly changed when another station is selected, i.e., when switchover to a different tuning-voltage value is effected, the thermal equilibrium corresponding to the present condition will not be reached until after a longer period of time, because the switchover to a different pulse duty factor changes the thermal load placed on the zener diode arrangement.

The problem shown could be solved by improving the temperature response, i.e. reducing the temperature coefficient, of the known temperature-compensated zener diodes by one to two orders of magnitude. Such an improvement using semiconductor technology would be prohibitively expensive, however.

SUMMARY OF THE INVENTION

The object of the invention is, therefore, to provide a temperature-compensated zener diode arrangement whose temperature drift during the periodic short-circuit operation explained above is not greater than during stable operation, i.e., the variations in the stabilized voltage during the periodic short-circuit operation are to remain so small as not to result in any appreciable frequency shift or the varactor-tuned radio or television sets. Thus, the known temperature-compensated zener diode arrangements are to be improved so that they can be subjected to the above-mentioned periodic short-circuit operation at a warrantable outlay for semiconductor devices (crystal size, usability of the standard planar technique, same package, same maximum dissipation) without adversely affecting the voltage- and temperature-stabilization characteristics.

According to a broad aspect of the invention, there is provided a temperature compensated zener diode arrangement in the form of a semiconductor integrated circuit of the type which includes several transistor structures formed within a common body of semiconductor material and interconnected by layers of metallization wherein the base-emitter pn junctions of the transistors structures are so connected in series relative to the direction of the total current flowing in operation that part of them are operated in the reversed direction up to the breakdown voltage as zener diodes while the remainder are operated in the forward direction as forward biased diodes, and wherein the emitter of the first transistor structure acting as a zener diode or the base of a transistor structure acting as a forward biased diode and the collector thereof are connected to a first external terminal, while the emitter of the last transistor structure acting as a forward biased diode is connected to a second external terminal, comprising a first additional transistor structure having its collected-emitter path coupled between said first and second external terminals and formed within said body of semiconductor material; a second additional transistor structure formed within said body having its emitter collector path coupled between said second external terminal and a third external terminal; and at least one dissipative structure coupled in series with the emitter-collector path of said second additional transistor structure between said second and third external terminals, said first and second additional transistor structure having bases each coupled to a fourth external terminal.

From DT-OSs Nos. 2,037,636 and 2,258,011 it is known to achieve a particularly low temperature coefficient in integrated shunt regulators comparable to zener diodes disposing on the same semiconductor crystal a dissipative component heating up the semiconductor crystal, and regulating the dissipation of this component as a function of the crystal temperature by means of an automatic control system in such a manner that the crystal temperature is maintained at a nominal value. As this prior art shows, however, these arrangements are extremely complex, and the integrated circuits obtained consist of many single structures. By contrast, the arrangement according to the invention is much simpler, since the object can be achieved by much simpler means.

The above and other objects of the present invention will be more clearly understood from the following detailed description taken in conjunction with the accompanying drawings, in which:

DESCRIPTION OF THE PREFERRED EMBODIMENT

Figure 1:
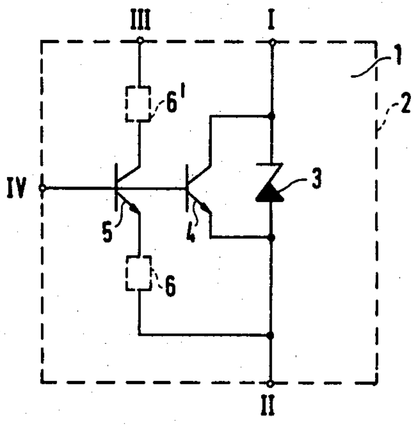
FIG. 1 is an equivalent circuit diagram of a temperature compensated zener diode arrangement according to the invention.

In FIG. 1, the equivalent circuit of the zener diode arrangement 1 according to the invention is shown within the dashed rectangle, which indicates the package 2 of the arrangement. A package especially suited for this purpose is a plastic case with four terminals which is commonly used for transistors and is referred to as a "pancake case."

The zener diode symbol 3 symbolizes the base-emitter pn junctions of the individual transistor structures, which junctions are partly reverse-biased and partly forward-biased and will be referred to in the description as the "actual zener diode." Connected in parallel with the acutal zener diode 3 is the collector-emitter path of a first additional transistor structure 4 formed within the same body of semiconductor material. This parallel circuit is inserted between a first external terminal I, serving as the cathode of the zener diode array 1, and a second external terminal II, serving as the anode of the array. Accordingly, the anode of the actual zener diode 3 is connected to the external terminal I, and the cathode to the external terminal II.

Between the second external terminal II and a third external terminal III, the emitter-collector path of a second additional transistor structure 5 and dissipative structures 6 and 6' are connected in series. The second additional transistor structure 5, too, is formed within the body of semiconductor material, and the dissipative structures 6 and 6' are formed within or on the body of semiconductor material.

The bases of the first and second additional transistor structures 4, 5 are connected to a fourth external terminal IV.

The dissipative structure 6, 6' may be a diode structure, a transistor structure, a diffused resistance structure, or a resistor deposited by evaporation, for example. The structures 6 and 6' may be connected, respectively, between the emitter of the second transistor structure 5 and the second external terminal II and between the collector of the second transistor structure 5 and the third external terminal III, as shown in FIG. 1 or vice versa. They may also surround the transistor structure in the form of rings.

Figure 2:
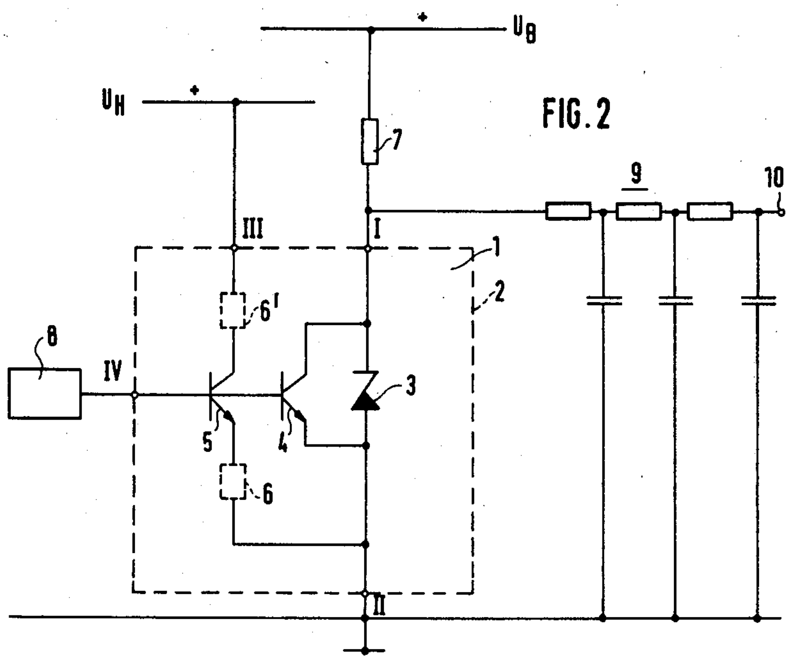
FIG. 2 shows an advantageous working circuit for the arrangement of FIG. 1.

FIG. 2 shows an advantageous working circuit for the temperature-compensated zener diode arrangement 1 of FIG. 1 which is especially suitable for use in digitally tuned television receivers. The first external terminal is connected to the hot terminal + of a supply voltage source $U_B$ via a series-dropping resistor 7, so the actual zener diode 3 and the series-dropping resistor 7 form a shunt regulator in the usual manner.

The third external terminal III is connected to the hot terminal + of an auxilliary voltage source $U_H$. Taking into account the dissipation in the structure 6 and the value of the series-dropping resistor 7, the voltage value of this auxilliary voltage source is chosen so that the dissipation in the temperature-compensated zener diode arrangement 1 will be constant if the fourth external terminal IV is connected to a pulse generator 8 generating a pulse train of variable pulse duty factor.

Connected between the external terminals I and II, the latter of which is grounded, is the input of a three section RC filter 9 whose output 10 provides the tuning voltage having the temperature stability required.

The temperature-compensated zener diode arrangement according to the invention can also be adapted for use in television sets with so-called stand-by heating, where the picture tube is equipped with instant heat cathodes and where other subcircuits, too, areenergized when the set is "off", provided that line voltage is applied. In this mode of operation, the circuit of FIG. 2 can be supplemented with external circuitry which is connected to the third and fourth external terminals III, IV, renders the second additional transistor structure 5 conductive, and passes such a current through the structure 6 that the temperature-compensated zener diode arrangement 1 will be preheated already during stand-by operation. This can be done in a simple manner by connecting suitable external resistors, e.g. a series-dropping resistor to the external terminal III and a voltage divider to the external terminal IV.

We claim:

1. A temperature compensated actual zener diode arrangement in the form of a semiconductor integrated circuit comprising:
   - a first external terminal connected to a said zener diode,
   - a second external terminal connected to said zener diode,
   - a first transistor structure having its collected-emitter path coupled between said first and second external terminals and formed within said body of semiconductor material;
   - a second transistor structure formed within said body having its emitter collector path coupled between said second external terminal and a third external terminal; and
   - at least one dissipative structure coupled in series with the emitter-collector path of said second transistor structure between said second and third external terminals, said first and seconnd transistor structure having bases each coupled to a fourth external terminal.

2. An arrangement according to claim 1 wherein said at least one dissipative structure is formed within said body of semiconductor material.

3. An arrangement according to claim 1 wherein said at least one dissipative structure is formed on said body of said semiconductor material.

4. An arrangement according to claim 1 wherein said dissipative structure is a diffused resistance structure.

5. An arrangement according to claim 1 wherein said dissipative structure is a resistor deposited by evaporation.

6. An arrangement according to claim 1 wherein said dissipative structure is a diode structure.

7. An arrangement according to claim 1 wherein said dissipative structure is a transistor structure.

8. An arrangement according to claim 1 wherein said dissipative structure surrounds said first and second transistor structures in the body of said semiconductor material in the form of a ring.

9. An arrangement according to claim 1 further comprising:
   - means for coupling a first source of supply voltage to said first external terminals;
   - means for supplying a second source of supply voltage to said third external terminal;
   - a pulse generator having an output coupled to said fourth external terminal for supplying a pulse train of variable pulse duty factor; and
   - a filter circuit coupled between said first and second external terminals for providing a tuning voltage.

* * * * *